(12) United States Patent
Kim et al.

(10) Patent No.: US 9,324,661 B2
(45) Date of Patent: Apr. 26, 2016

(54) SEMICONDUCTOR PACKAGE AND METHOD OF MANUFACTURING THE SAME

(71) Applicant: Samsung Electronics Co., Ltd., Suwon-si, Gyeonggi-do (KR)

(72) Inventors: Doo-Jin Kim, Cheonan-si (KR); Young-Sik Kim, Cheonan-si (KR); Tea-Seog Um, Asan-si (KR); Yong-Dae Ha, Asan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/673,852

(22) Filed: Mar. 30, 2015

(65) Prior Publication Data
US 2015/0279787 A1 Oct. 1, 2015

(30) Foreign Application Priority Data
Apr. 1, 2014 (KR) .................. 10-2014-0038560

(51) Int. Cl.
*H01L 23/544* (2006.01)
*H01L 23/52* (2006.01)
*H01L 25/07* (2006.01)
(Continued)

(52) U.S. Cl.
CPC ........ *H01L 23/544* (2013.01); *H01L 21/67144* (2013.01); *H01L 25/074* (2013.01); *H01L 25/50* (2013.01); *H01L 21/6836* (2013.01); *H01L 2221/68354* (2013.01); *H01L 2221/68381* (2013.01); *H01L 2223/54426* (2013.01); *H01L 2223/54486* (2013.01); *H01L 2224/05553* (2013.01); *H01L 2224/32145* (2013.01); *H01L 2224/32225* (2013.01); *H01L 2224/48091* (2013.01); *H01L 2224/48145* (2013.01); *H01L 2224/48147* (2013.01); *H01L 2224/73265* (2013.01); *H01L 2225/06562* (2013.01); *H01L 2924/15311* (2013.01); *H01L 2924/181* (2013.01)

(58) Field of Classification Search
CPC ..... H01L 23/544; H01L 25/074; H01L 25/50; H01L 2223/54486; H01L 2224/73265
USPC .................. 257/685, 686, 723, 777, E25.006, 257/E25.013, E25.021, E25.027, E23.085, 257/797, E23.179
See application file for complete search history.

(56) References Cited

U.S. PATENT DOCUMENTS 6,133,626 A 10/2000 Hawke et al.
7,537,959 B2 5/2009 Lee et al.
(Continued)

FOREIGN PATENT DOCUMENTS

KR 101259754 5/2013

*Primary Examiner* — Jasmine Clark
(74) *Attorney, Agent, or Firm* — Renaissance IP Law Group LLP

(57) ABSTRACT

An aligning guide, a semiconductor package comprising an aligning guide, and a method of manufacturing a semiconductor package comprising an aligning guide are provided. The semiconductor package may comprise a circuit board and an aligning guide mounted on the circuit board. The aligning guide may have a plurality of stepped portions. A plurality of semiconductor chips may be stacked on the circuit board and engage with the stepped portions of the aligning guide. According to the disclosed semiconductor package, a large number of semiconductor chips may be stacked with high accuracy and sufficient margin. Therefore, the rate of failure and defects in the chip stacking process may be reduced and the reliability and stability of the semiconductor package may be enhanced.

18 Claims, 15 Drawing Sheets

(51) Int. Cl.
  *H01L 25/00*  (2006.01)
  *H01L 21/67*  (2006.01)
  *H01L 21/683* (2006.01)

(56) References Cited

U.S. PATENT DOCUMENTS

| | | |
|---|---|---|
| 7,902,666 B1 | 3/2011 | Hsu et al. |
| 7,928,591 B2 | 4/2011 | Chen |
| 7,937,829 B2 | 5/2011 | Petersen et al. |
| 7,964,947 B2 | 6/2011 | Mohammed et al. |
| 8,004,848 B2 | 8/2011 | Baek et al. |
| 8,110,910 B2 | 2/2012 | Kim |
| 8,169,065 B2 | 5/2012 | Kohl et al. |
| 8,426,951 B2 | 4/2013 | Han |
| 8,508,044 B2 | 8/2013 | Ko |
| 8,513,793 B2 | 8/2013 | Han |
| 8,536,689 B2 | 9/2013 | Dimaano, Jr. et al. |
| 2004/0200814 A1 | 10/2004 | Patel |
| 2008/0309510 A1 | 12/2008 | Mandagaran |
| 2013/0093103 A1 | 4/2013 | Kim et al. |
| 2013/0256911 A1 | 10/2013 | Lee et al. |
| 2015/0108662 A1* | 4/2015 | Chen ............ H01L 25/0652 257/777 |

* cited by examiner

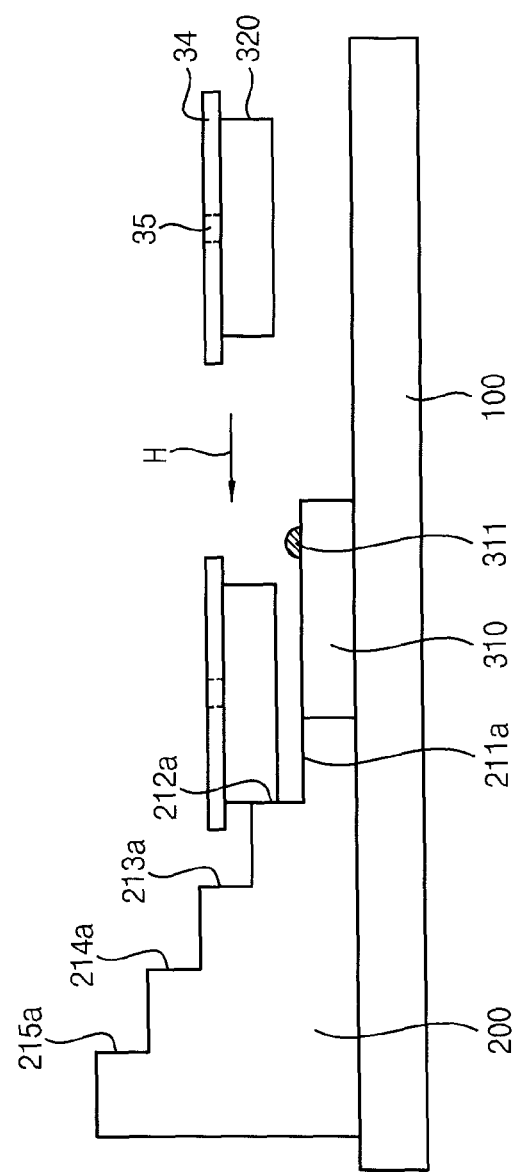

SEMICONDUCTOR PACKAGE AND METHOD OF MANUFACTURING THE SAME

CROSS-REFERENCE TO RELATED APPLICATIONS

This application claims priority under 35 U.S.C. §119 to Korean Patent Application No. 10-2014-0038560 filed on Apr. 1, 2014 in the Korean Intellectual Property Office, the disclosure of which is incorporated by reference herein in its entirety.

BACKGROUND

1. Field

The present inventive concepts relate to a semiconductor package and a method of manufacturing the same, and in particular, to a chip stack package having an aligning guide and a method of manufacturing a chip stack package using an aligning guide. Example embodiments provide a fixing module for fixing an optical system and an optical apparatus having the same. More particularly, a two-point type fixing module may be provided for manufacturing semiconductor chips to which an optical system is affixed using the two-point type fixing unit.

2. Description of the Related Art

Recently, there has been a sharp rise in demand for semiconductor packages having high capacity and small size. Since a memory chip has an intrinsic limit in its degree of integration, a chip stack package and a multi-stack package in which semiconductor chips or packages may be vertically stacked have been widely used for satisfying the demand for highly integrated components.

A cascade stack structure is one type of chip stack package. In the cascade stack structure, semiconductor chips (such as memory chips) may be stacked in a stair-shape configuration with an upwardly facing active face, and with bonding and/or contact pads arranged on peripheral portions of the top faces of the semiconductor chips.

In the cascade stack structure, however, as the number of the stacked chips increases, it becomes more difficult to control the misalignment between adjacent chips. The misalignment issue is very significant because only one misalignment of any one of the stacked chips in the cascade stack can cause total failure of the chip stack package since it prevents uniform connection of boding wires. Moreover, as the number of stacked chips increases, the structural stability of the cascade stack is reduced.

SUMMARY

Example embodiments of the present inventive concepts provide a semiconductor package having a chip aligning guide for preventing misalignment between memory chips that are stacked on a single circuit board.

Example embodiments of the present inventive concepts provide a method of manufacturing a semiconductor package using a chip aligning guide.

According to an aspect of the present inventive concepts, a semiconductor package may comprise a circuit board, an aligning guide mounted on the circuit board and having a stepped portion, and a plurality of semiconductor chips stacked on the circuit board and engaging with the stepped portion of the aligning guide.

According to another aspect of the present inventive concepts, a semiconductor package may include a circuit board, an aligning guide mounted on the circuit board, and a plurality of semiconductor chips stacked on the circuit board in a stair-shaped configuration and aligned by the aligning guide.

According to another aspect of the present inventive concepts, a method of manufacturing a semiconductor package may comprise the step of providing a circuit board having a plurality of mounting areas, the step of mounting an aligning guide having a stepped portion on at least one of the mounting areas of the circuit board; and the step of stacking a plurality of semiconductor chips on the mounting area of the circuit board in such a way that the stacked semiconductor chips fit with the stepped portion of the aligning guide.

The step of stacking the plurality of the semiconductor chips may comprise the step of transferring one of the semiconductor chips over a portion of the mounting area which is a bit apart from a vertical face of the stepped portion of the aligning guide, the step of moving the transferred semiconductor chip toward the circuit board until its side face is partially overlapped with the vertical face of the aligning guide, the step of moving the transferred semiconductor chip toward the aligning guide until a side face of the transferred semiconductor chip contacts the vertical face of the aligning guide, and the step of moving the transferred semiconductor chip toward the circuit board until a bottom face of the semiconductor chip contacts with a flat face of the stepped portion of the aligning guide or a top face of the circuit board.

According to the chip stack package of the present inventive concepts, by using an aligning guide having a stepped portion engaging with the stacked semiconductor chips, a large number of semiconductor chips may be stacked on the circuit board with high accuracy and sufficient margin. The stacked semiconductor package may further have high structural stability, and the chip stack package may have high resistance to the warpage and distortion. These effects may further result in reducing the rate of failure and defects in the chip stacking process and in enhancing the reliability and stability of the end products.

In one embodiment, a semiconductor package may include a circuit board, an aligning guide coupled to the circuit board and having a cascade structure. The cascade structure of the aligning guide may include a plurality of stepped portions each having a flat face and a vertical face. A plurality of semiconductor chips may be stacked on the circuit board along the aligning guide such that a first peripheral portion of each of the semiconductor chips contacts a corresponding stepped portion of the aligning guide, and an active face of each of the semiconductor chips faces upwards. The active face of each semiconductor chip may be exposed at a second peripheral portion arranged opposite to the first peripheral portion and which does not contact the aligning guide. A connector may be provided to electrically connect the circuit board and the plurality of the semiconductor chips.

Bottom faces of each of the semiconductor chips, other than a lowermost semiconductor chip, may contact a flat face of a corresponding stepped portion of the aligning guide at the first peripheral portion, such that a gap between the circuit board and the first peripheral portion of each of the semiconductor chips may be filled by the aligning guide.

In an example embodiment, 12 to 36 semiconductor chips may be stacked on the circuit board.

In an example embodiment, a hardness of the aligning guide may be lower than that of the semiconductor device, thereby preventing damage to the semiconductor chips that may otherwise be caused by the aligning guide.

In an example embodiment, the aligning guide may include an elastic resin.

In an example embodiment, the vertical face may have a height corresponding to a thickness of the semiconductor device.

In an example embodiment, the aligning guide may be adhered to the circuit board by an adhesive.

In an example embodiment, the semiconductor package may further include a molding unit covering the aligning guide, the semiconductor chips, and the wiring, such that the aligning guide and the semiconductor chips may be separated and isolated from the surroundings.

In an example embodiment, the connector may include a bonding wire connecting contact pads on the active face of each semiconductor chip to each other and further connecting the contact pad on the active face with a bonding pad on the circuit board.

According to another aspect of the present inventive concepts, a method of manufacturing the semiconductor package may also be provided. In the method, a circuit board having a plurality of mounting areas may be prepared and a cascade-structured aligning guide may be coupled to one or more of the mounting areas of the circuit board. The aligning guide may have a cascade structure with a plurality of stepped portions, each of which may have a flat face and a vertical surface perpendicular to the flat face. A plurality of semiconductor chips may be mounted along the cascade structure of the aligning guide such that a first peripheral portion of each of the semiconductor chips may contact a corresponding stepped portion of the aligning guide with an active face of each of the semiconductor chips facing upwards. The active face of each semiconductor chip may further be exposed at a second peripheral portion that is arranged opposite the first peripheral portion and which does not contact the aligning guide. The circuit board and the plurality of the semiconductor chips may be connected to each other.

In an example embodiment, the plurality of semiconductor chips may be mounted at the mounting area using the following steps: The semiconductor chip may be picked from a substrate held in a substrate holder, and the semiconductor chip may be moved vertically downwards to the mounting area corresponding thereto in a first vertical transfer process. Then, the semiconductor chip may be aligned with the stepped portion of the aligning guide through a horizontal transfer process, in which the semiconductor chip may be transferred horizontally towards the aligning guide such that the vertical face of the stepped portion of the aligning guide may contact a side surface of the first peripheral portion of the semiconductor chip. The aligned semiconductor chip may then be moved vertically downwards by a second vertical transfer process until one of the flat faces of the aligning guide contacts or an upper surface of the circuit board contacts a bottom face of the first peripheral portion of the semiconductor chip.

In an example embodiment, the side surface of the first peripheral portion of the semiconductor chip may partially overlap the vertical face of the stepped portion of the aligning guide in the first vertical transfer process.

In an example embodiment, the step of aligning the semiconductor chip with the stepped portion of the aligning guide may include detecting whether or not the flat face of the stepped portion of the aligning guide is in contact with a bottom face of the first peripheral portion of a corresponding semiconductor chip.

In an example embodiment, the step of connecting the circuit board and the plurality of the semiconductor chips may include electrically connecting contact pads on the active faces of the second peripheral portions of the semiconductor chips to each other in series, and electrically connecting a bonding pad arranged on the circuit board with the contact pads of the semiconductor chips.

In an example embodiment, a molding unit may be formed on the circuit board to cover the aligning guide, the semiconductor chips, and the wiring, such that the aligning guide and the semiconductor chips may be separated and isolated from the surroundings. The circuit board may then be separated into unit packages corresponding to the mounting areas.

According to example embodiments of the present inventive concepts, the cascade-structure aligning guide may be arranged on the circuit board, and the stacked semiconductor chips may be easily aligned with each other using the aligning guide as the semiconductor chips are mounted on the circuit board. The aligning guide may include a plurality of stepped portions and each stepped portion may include a flat face and a vertical surface. The vertical surface may contact a side surface of a corresponding semiconductor chip, and the flat face may contact a bottom surface of a corresponding semiconductor chip at a first peripheral portion thereof. Thus, each semiconductor chip may be offset from a subsequently stacked chip according to a width of the stepped portion.

In other words, the semiconductor chips may be readily aligned with each other and offset from each other by a uniform length defined by the width of the upper face of each step of the aligning guide. The active faces of the semiconductor chips may thereby be exposed to surroundings at second peripheral portions thereof, each second peripheral portion having a width substantially equal to a length of the offset. Accordingly, the contact pads on the active faces may be sufficiently exposed to surroundings when the semiconductor chips are vertically stacked on the circuit board. In addition, the aligning guide may help prevent warpage of the circuit board when operating the semiconductor package 1000, thereby further reducing operating failures of the semiconductor package 1000.

According to aspects of the inventive concepts, operational failures of the semiconductor package may be minimized and an electronic system incorporating the semiconductor package may have improved operational stability and reliability.

BRIEF DESCRIPTION OF THE DRAWINGS

The foregoing and other features and advantages of the inventive concepts will become readily apparent from the following descriptions, made with reference to the accompanying drawings, in which:

FIGS. 7A to 7G are cross sectional views illustrating processing steps for aligning semiconductor chips using the aligning guide in the chip mounting process of FIG. 6.

DETAILED DESCRIPTION OF THE EMBODIMENTS

Figure 1A:
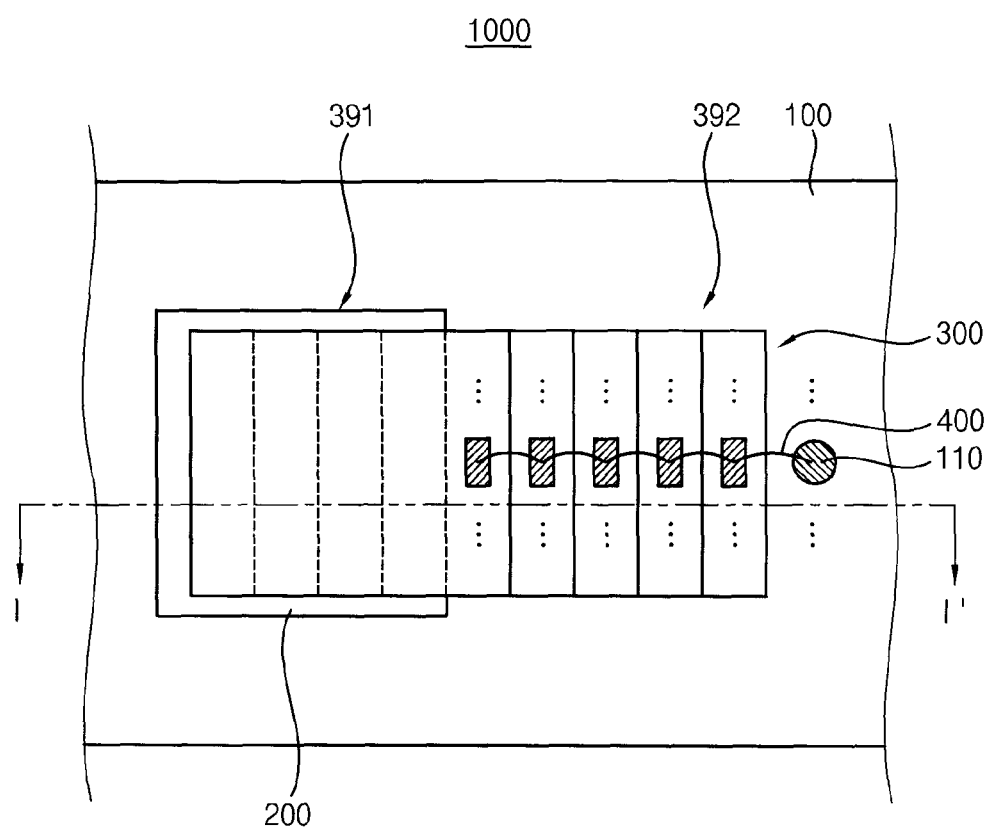
FIG. 1A is a plan view illustrating a chip stack package in accordance with an exemplary embodiment of the present inventive concepts.

Various example embodiments will be described in detail hereinafter with reference to the accompanying drawings. The present invention may, however, be embodied in many different forms and should not be construed as being limited to the example embodiments set forth herein. Rather, these embodiments are provided so that this disclosure will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper," "top", "bottom", "side" and the like, may be used herein for ease of description to describe relative positions of an element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). Accordingly, variations from the shapes of the illustrations as a result, for example, of manufacturing techniques and/or tolerances, are to be expected. That is, example embodiments should not be construed as being limited to the particular shapes of regions illustrated herein, but are to be interpreted to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present inventive concepts relate. It will be further understood that terms, such as those defined in commonly used dictionaries, should be interpreted as having a meaning that is consistent with their meaning in the context of the relevant art and should not be interpreted in an idealized or overly formal sense unless expressly defined herein.

Hereinafter, example embodiments will be explained in detail with reference to the accompanying drawings.

Figure 1B:
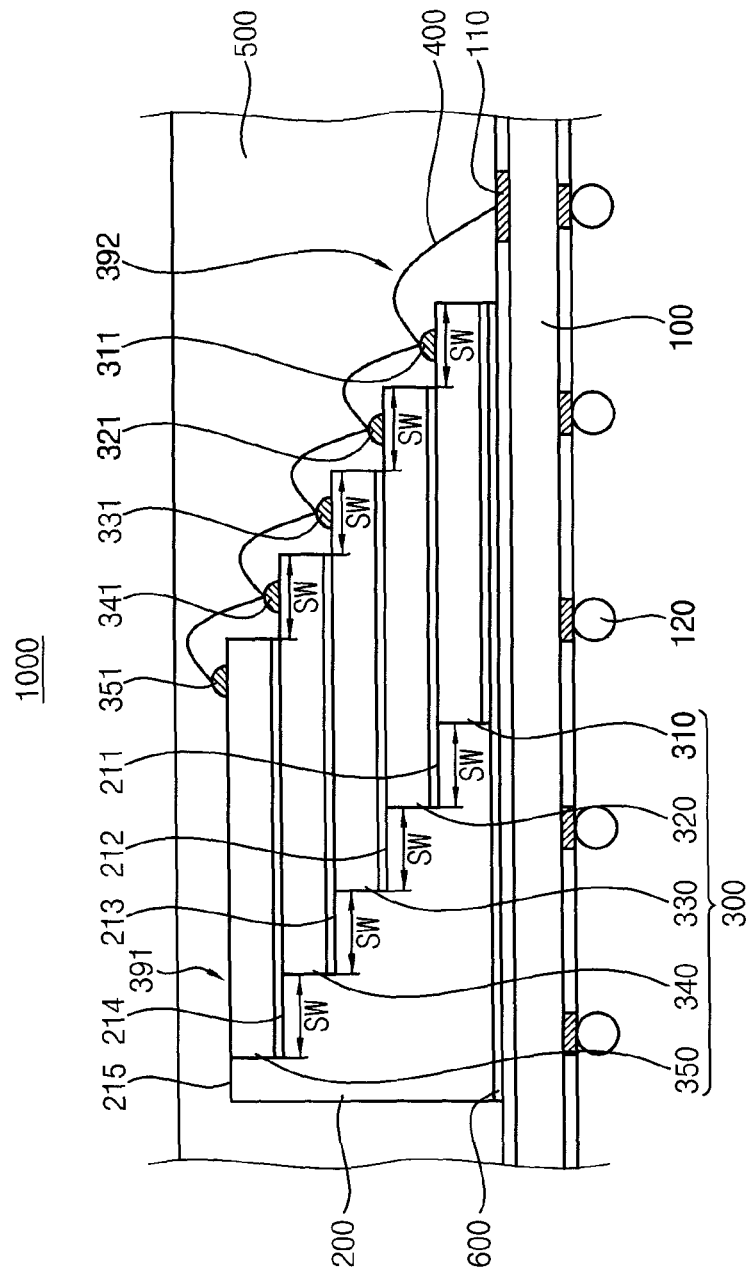
FIG. 1B is a cross-sectional view taken along line I-I' in FIG. 1A.
Figure 2:
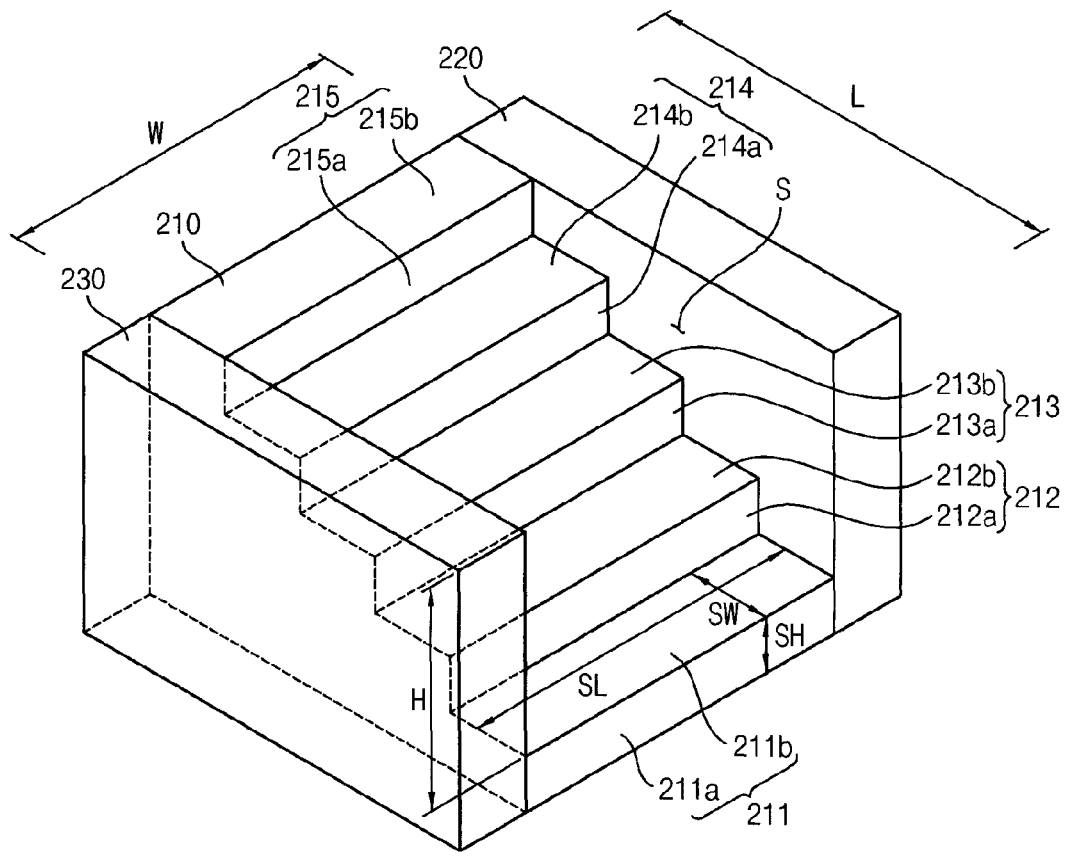
FIG. 2 is a perspective view illustrating the aligning guide of the chip stack package in FIGS. 1A and 1B.

FIG. 1A is a plan view illustrating a chip stack package in accordance with an exemplary embodiment of the present inventive concepts. FIG. 1B is a cross-sectional view taken along line I-I' in FIG. 1A. FIG. 2 is a perspective view illustrating the aligning guide of the chip stack package in FIGS. 1A and 1B. While the present example embodiment illustrates a chip stack package in which a plurality of semiconductor chips are stacked on a circuit board in a cascade structure and electrically connected to the circuit board by a bonding wire, these concepts may also be applied to any other semiconductor packages stacked in a cascade structure.

Referring to FIGS. 1A, 1B and 2, the chip stack package 1000, constructed in accordance with an exemplary embodiment of the present inventive concepts, may comprise a circuit board 100, an aligning guide 200 mounted on the circuit board 100 and having a cascade structure with stepped portions 211 to 215. Each stepped portion may include a flat upper face and a vertical surface perpendicular to the flat face. A plurality of semiconductor chips 300 are stacked on the circuit board 100 along the cascade structure of the aligning guide 200, and engage with a corresponding stepped portions 211 to 215 of the aligning guide 200. More specifically, a first peripheral portion of each of the semiconductor chips 300 may contact a corresponding stepped portion of the aligning guide 200 with an active face of each semiconductor chip 300 facing upwards. The chips are aligned with the aligning device such that a portion of the active face of each semiconductor chip 300 may be exposed at a second peripheral portion, which is arranged opposite to the first peripheral portion and does not contact the aligning guide 200. A connector 400 (or a plurality of connectors), electrically connects the circuit board 100 and the plurality of the semiconductor chips 300. The chip stack package 1000 may further comprise a molding unit 500 sealing the aligning guide 200, the semiconductor chips 300 and the connector 400. The package 1000 may thereby be sealed and isolated from the surroundings.

The circuit board 100 may be a substantially rigid plate comprising insulating and heat-resistive materials. Circuit patterns (not shown) may be arranged on the circuit board 100, and may be insulated from one another by an insulation layer. The circuit patterns may be connected to a plurality of bonding pads 110 arranged on top and/or bottom faces of the circuit board 100, so that the semiconductor chips 300 and various external systems (not shown) may be electrically connected to each other through the circuit patterns.

The upper bonding pads 110 may, for example, be electrically connected to the contact pads 311 to 351 of the semiconductor chips 300, and the bottom bonding pads 110 may be electrically connected to the external system via a contact terminal 120. The contact terminal may, for instance, comprise a solder ball.

The body of the circuit board 100 may, for example, comprise thermosetting plastic such as an epoxy resin or a polyimide. Otherwise, the body of the circuit board 100 may be a plate coated with a heat-resistive organic film such as a liquid crystal polyester film and a polyamide film. The circuit patterns may comprise a plurality of conductive lines or wirings that may be arranged on the circuit board 100, and may comprise a power line for supplying an electric power, a plurality of signal lines for communicating data signals with the semiconductor chips 300, and a ground line for electrically grounding the signal lines and the power line. The conductive lines or the wirings of the circuit pattern may be electrically insulated from one another by insulation layers. The circuit board 100 may be a printed circuit board (PCB) in which the circuit patterns are formed by a printing process.

The aligning guide 200 may, for example, comprise a guide body 210, a first sidewall 220, and a second sidewall 230. The guide body 210 may comprise a plurality of stepped portions 211 to 215, and each of the stepped portions may have a flat face 211*b* to 215*b* and a vertical surface 211*a* to 215*a* that is substantially perpendicular to the flat face. The first and the second sidewalls 220 and 230 may be arranged at opposite sides of the guide body 210, respectively, and may aid in aligning the semiconductor chips 300 with the guide body 210.

In the present example embodiment, the guide body 210 may include first to fifth stepped portions 211 to 215, and each of the stepped portions may include a flat upper surface (or "face") 211 to 215*b*, respectively, and a vertical surface 211*a* to 215*a*, respectively.

The first and the second sidewalls 220 and 230 may provide sidewalls of each stepped portion 211 to 215, so that the stepped portions 211 to 215, the first sidewall 220, and the second sidewall 230 together define an aligning space S in which the semiconductor chip 300, may be stacked and aligned. The aligning space S may have a length L extending in a first direction x, a width W extending in a second direction y, and a height H extending in a third direction z. The stepped portions 211 to 215 may be arranged into a stair-like cascade structure in the aligning space S. Each of the stepped portions 211 to 215 may have a stair length SL extending in the first direction x, a stair width SW extending in the second direction y, and a stair height SH extending in the third direction z.

The stair height SH may correspond to a thickness of a corresponding one of the semiconductor chips 310, 320, 330, 340, 350, respectively, and the stair width SW may correspond to a desired offset length for the semiconductor chips 310, 320, 330, 340, 350. The semiconductor chips 300 may be stacked in the aligning space S to engage with the stepped portions 211 to 215 of the aligning guide 200 such that a first peripheral portion of each semiconductor chip 310, 320, 330, 340, 350 may be shifted toward the corresponding stepped portion by the offset length, and such that a second peripheral portion (arranged opposite the first peripheral portion) is not covered by subsequently arranged semiconductor chip by the same offset length. Therefore, a top face of each semiconductor chip 310 to 340 may be exposed from beneath a subsequently stacked semiconductor chip by an amount equal to the stair width SW. While the stepped portions 211 to 215 have the same dimension and configuration with each other in this embodiment, the configurations of the stepped portions 211 to 215 may be adjusted according to the dimension and configuration of the desired semiconductor chips 300, and may have dimensions that differ from one another.

By stacking the semiconductor chips 300 in the aligning space S, misalignment of the semiconductor chips 300 in the second direction y, may be prevented by the first and second sidewalls 220 and 230, respectively. In some embodiments, only one of the first and the second sidewalls 220 and 230 may be provided with the guide body 210. In this case, the y direction alignment function can be achieved using the single sidewall 220 or 230. Further, where the semiconductor chips 310, 320, 330, 340, 350 have different sizes in the second direction y, the guide body 210 may be provided without sidewalls 220, 230. That is, the first and second sidewalls 220 and 230, respectively, may be selectively provided according to the size of the semiconductor chips 310 to 350 and the aligning requirements for the particular application.

While the present example embodiment includes first to fifth stepped portions 211 to 215, the aligning guide 200 may have more or fewer than five stepped portions according to the number of semiconductor chips 300 to be stacked. In some embodiments, for example, 12 to 36 semiconductor chips 300 may be stacked on the circuit board 100. In this case, 12 to 36 stepped portions may be provided in the guide body 210, with a corresponding number of step faces provided in the aligning space S.

Since the aligning guide 200 directly contacts the semiconductor chips 300, there is a risk that the aligning guide 200 may cause damage to the semiconductor chips 300 in the process of mounting the semiconductor chips 300 onto the circuit board 100. In order to prevent such damage, the aligning guide 200 may be made of a material that is softer than the semiconductor chips 300. In other words, a hardness of the aligning guide 200 may be lower than a hardness of the semiconductor chips 300. For example, the aligning guide 200 may be made of an elastic resin such as urethane.

The semiconductor chips 300 may include a memory chip, a logic chip and/or an assembly thereof. The memory chip may comprise a DRAM, an SRAM, a flash memory, a PRAM, a resistive RAM, a ferroelectric RAM, a magnetic RAM, or other memory type.

One or more semiconductor chips 300 may include a plurality of conductive structures (not illustrated) stacked on a semiconductor substrate such as a silicon wafer using a plurality of insulation interlayers and a plurality of wiring structures separated from the conductive structures by the insulation interlayers for transferring signals to the conductive structures. The conductive structures and the wiring structures may be protected from the surroundings by a passivation layer. A plurality of contact pads 311, 321, 331, 341, and 351 may be arranged on the exposed top faces of the semiconductor chips 300 and external signals may be applied to the semiconductor chips 300 via the contact pads 311, 321, 331, 341, and 351.

The wiring structure may include a metal plug penetrating through the insulation interlayer and contacting the conductive structure, and a metal wiring extending along the insulation interlayer and connected to the metal plug. The metal wiring may include a signal line for transferring input/output signals to the conductive structure, a power line for applying an electric power to the conductive structure, and a ground line for electrically grounding the conductive structure.

In the present example embodiment, a plurality of the semiconductor chips 300 may be stacked at each of the mounting areas. Contact pads may be arranged at a peripheral portion of each of the semiconductor chips 300 (i.e., edge type chips). A peripheral portion of each semiconductor chip 300 closest to the aligning guide is referred to as the first peripheral portion 391, and the peripheral portion opposite the first peripheral portion is referred to as the second peripheral portion 392. The contact pads may therefore be arranged on the second peripheral portion 392 of each of the semiconductor chips 300. That is, the first peripheral portion of the semiconductor chip 300 may contact the vertical surface of a corresponding stepped portion of the aligning guide 200, and the contact pads may be exposed at the second peripheral portions of the semiconductor chips 300.

In the present example embodiment, first to fifth chips 310, 320, 330, 340, and 350 are stacked along the stepped portions 211 to 215, respectively, of the aligning guide 200, and first to fifth contact pads 311, 321, 331, 341, and 351, respectively, may be exposed at the peripheral portions 392 of the first to fifth semiconductor chips 310, 320, 330, 340, and 350, respectively. Although this embodiment includes five chips, a much greater number of chips may be stacked in the aligning space S.

The semiconductor chips 310, 320, 330, 340, and 350 may be stacked on the circuit board 100 in such a configuration that side surfaces of the semiconductor chips 310, 320, 330, 340, and 350 contact corresponding vertical surfaces 211a to 215a of the aligning guide 200. Bottom faces of the semiconductor chips 310, 320, 330, 340, and 350 contact corresponding flat faces 211b to 215b of the aligning guide 200, as illustrated in FIG. 1B. A second chip 320 may be stacked on the active face of the first chip 310 with the first peripheral portion of the second chip 320 contacting the second vertical surface 212a of the second stepped portion 212 of the aligning guide 200. Since each of the vertical surfaces 212a to 215a is shifted from the adjacent vertical surfaces by an amount equal to the stair width SW, each of the subsequently stacked semiconductor chips 320, 330, 340, and 350 will be shifted by that same amount with respect to the previously stacked chip. Thus, the top face of each semiconductor chip 310, 320, 330, and 340 may have an exposed portion with a width equal to the stair width SW. A contact pad 311 to 315 may be provided on a corresponding one of the exposed top faces. 310 as much as the offset length corresponding to the floor width SW.

A side surface of the second chip 320 may contact the second vertical surface 212a, and a bottom face of the second chip 320 may contact the first flat face 211b at the first peripheral portion 391. The active face of the first chip 310 may be exposed to surroundings at the second peripheral portion 392 of the first chip 310. As a result, the first and the second chips 310 and 320 may be stacked in a cascade structure. The first contact pad 311 of the first chip 310 may be exposed to surroundings.

Further, the third chip 330 may be stacked on the active face of the second chip 320 with the first peripheral portion of the third chip 330 contacting the third vertical face 213a of the third stepped portion 213 of the aligning guide 200. A side surface of the third chip 330 may contact the third vertical surface 213a, and a bottom face of the third chip 330 may contact the second flat face 212b at the first peripheral portion 391 thereof, so that the active face of the second chip 320 may be exposed to surroundings at the second peripheral portion 392. As a result, the second and the third chips 320 and 330 may also be stacked in a cascade structure. The second contact pad 321 of the second chip 320 may be exposed to surroundings.

In the same way, the fourth and fifth chips 340 and 350, respectively, may be stacked on the active faces of the third and fourth chips 330 and 340, respectively, in a similar cascade structure. Thus, the third and fourth contact pads 331 and 341, respectively, may also be exposed to surroundings at the second peripheral portion 392. The fifth chip 350 may be stacked at a top floor of the cascade-structured aligning guide 200, so that the active face of the fifth chip 350 may be substantially coplanar with the fifth flat face 215b, and the fifth contact pad 351 may also be exposed to the surroundings at the second peripheral portion of the fifth chip 350.

A gap between the circuit board 100 and the bottom faces of the second to fifth chips 320, 330, 340, and 350 at the first peripheral portion 391 thereof may be filled by the aligning guide 200. That is, the first to fifth chips 310, 320, 330, 340, and 350, respectively, may be properly aligned with each other, and each subsequent chip may be shifted along the first direction x from a previous chip by the offset length, so that the contact pads 311, 321, 331, and 341 of the first to fourth chips 310, 320, 330, and 340, respectively, may be prevented from being covered by a subsequent chip.

Each of the contact pads 311, 321, 331, 341, and 351 may be electrically connected to the bonding pads 110 of the circuit board 100 by the connector 400. For example, the connector 400 may be a bonding wire.

Each of the semiconductor chips 310, 320, 330, 340, and 350 may have more than one contact pad. The circuit board 100 also may have more than one bonding pad 110. In this case, the contact pads and the bonding pads may be electrically connected through connectors in various ways . . . . The semiconductor chips 300 may be electrically connected to the circuit patterns in the circuit board 100 via the connector 400, and the circuit patterns in the circuit board 100 may be electrically connected to the external system (not shown) via the contact terminal 120 at the bottom face of the circuit board 100. Therefore, the semiconductor chips 300 mounted on the circuit board 100 may be electrically connected to the external system.

In the present example embodiment, the fifth to first contact pads 351, 341, 221, 321, and 311 are sequentially connected to each other, and the first contact pad 311 is connected to the bonding pad 110. Thus, the first to fifth semiconductor chips 310, 320, 330, 340, and 350 are electrically connected to each other and may function as a single channel in the semiconductor package 1000. In an alternative embodiment, a plurality of semiconductor chips may be classified into any desired number of groups, and chips arranged in the same group may be electrically connected to each other. Each group of chips may therefore function as an individual channel in the semiconductor package 1000. For example, when a greater number of chips is stacked on the circuit board 100, the chips may be classified into more groups, and a greater number of channels may be provided in the semiconductor package 1000. For example, when 12-36 semiconductor chips 300 are stacked on the circuit board 100, multiple different channels may be provided in the semiconductor package 1000.

In particular, when the first chip 310 comprises a logic chip and the second to fifth chips 320, 330, 340, and 350 comprise memory chips, the connector 400 may include a logic connector and a memory connector. In such a case, the logic chip 310 may include a wafer level chip and each memory chip 320, 330, 340, and 350 may include a dice level chip, so that a plurality of dice level chips 320, 330, 340, and 350 may be stacked on the single wafer level logic chip 310.

In the present embodiment, the aligning guide 200 and the first semiconductor chip 310 may be adhered to the circuit board 100 by the same or different adhesive 600. The second to fifth semiconductor chips 320 to 350 may be adhered to each other by various adhesives. For example, dicing tapes or solder paste may be used as adhesive.

While the present example embodiment discloses the aligning guide 200 and the first chip 310 adhered to the circuit board 100 by the same adhesive 600, the aligning guide 200 and the first chip 310 may be individually adhered to the circuit board 100 by different, respective adhesives.

In the present embodiment, the molding unit 500 may cover the aligning guide 200, the semiconductor chips 300, and the connector 400 for fixation and protection thereof. More particularly, the molding unit 500 may secure the aligning guide 200, the semiconductor chips 300, and the connector 400 to the circuit board 100 and may protect them from external surroundings. The molding unit 500 may comprise an insulating resin having a sufficient rigidity, such as an epoxy molding compound (EMC). The EMC may be arranged over an entire surface of the circuit board 100 with a sufficient thickness to cover the aligning guide 200, the semiconductor chips 300, and the connector 400.

Various heat dissipating members (not shown) may be further provided on the molding unit 500, to effectively dissipate operating heat away from the semiconductor chips 300. Particularly, when a plurality of memory chips are stacked in the semiconductor package 1000, various heat dissipating particles and other heat radiators may be arranged in the molding unit 500.

In an example embodiment of the semiconductor package 1000, the aligning guide 200 may be arranged on the circuit board 100, and the semiconductor chips 300 may be systematically aligned with each other at the first peripheral portions thereof using the aligning guide 200 as they are mounted and stacked on the circuit board 100.

The aligning guide 200 may include a plurality of stepped portions and each stepped portion may include a flat face and a vertical surface. Each vertical surface may contact a side surface of a corresponding semiconductor chip, and the flat face may contact a the bottom surface of a corresponding semiconductor chip at a first peripheral portion thereof. Thus, the semiconductor chips may be sequentially shifted from a previous chip by an offset length corresponding to the stair width of the stepped portion.

The semiconductor chips may therefore be readily and easily aligned with each other with the desired amount of shift, using the stair-shaped structure of the aligning guide. Active faces of the semiconductor chips may be exposed to surroundings at the second peripheral portions thereof, which have widths corresponding to the offset length. Accordingly, the contact pads on the active faces may be sufficiently exposed to surroundings when the plurality of semiconductor chips is vertically stacked on the circuit board. In addition, the aligning guide may also prevent warpage of the circuit board while operating the semiconductor package 1000, thereby reducing the operation failures of the semiconductor package 1000.

As described in the above example embodiment, according to a chip stack package of the present inventive concepts, by means of the aligning guide having a stepped portion engaging the stacked semiconductor chips, a large number of semiconductor chips may be stacked on a circuit board with high accuracy and sufficient margin. Also, the stacked semiconductor package may have high structural stability owing to the structural support provided by the aligning guide. In addition, the chip stack package may have high resistance to warpage or other distortion because the aligning guide may increase the rigidity of the chip stack package. These effects may result in reducing the rate of failure and defects in the chip stacking process and enhancing the reliability and stability of the end products.

The semiconductor package according to the present inventive concepts may be modified depending on the desired usage environments and requirements thereof. In particular, the semiconductor package of the present inventive concepts may be applied to a package on package (PoP) structure in which the same or different semiconductor packages are vertically stacked to increase the degree of integration by reducing a mounting area. In such a design, warpage of the upper package may be sufficiently prevented using the present inventive concepts, thereby increasing the operational reliability of the PoP.

Figure 3:
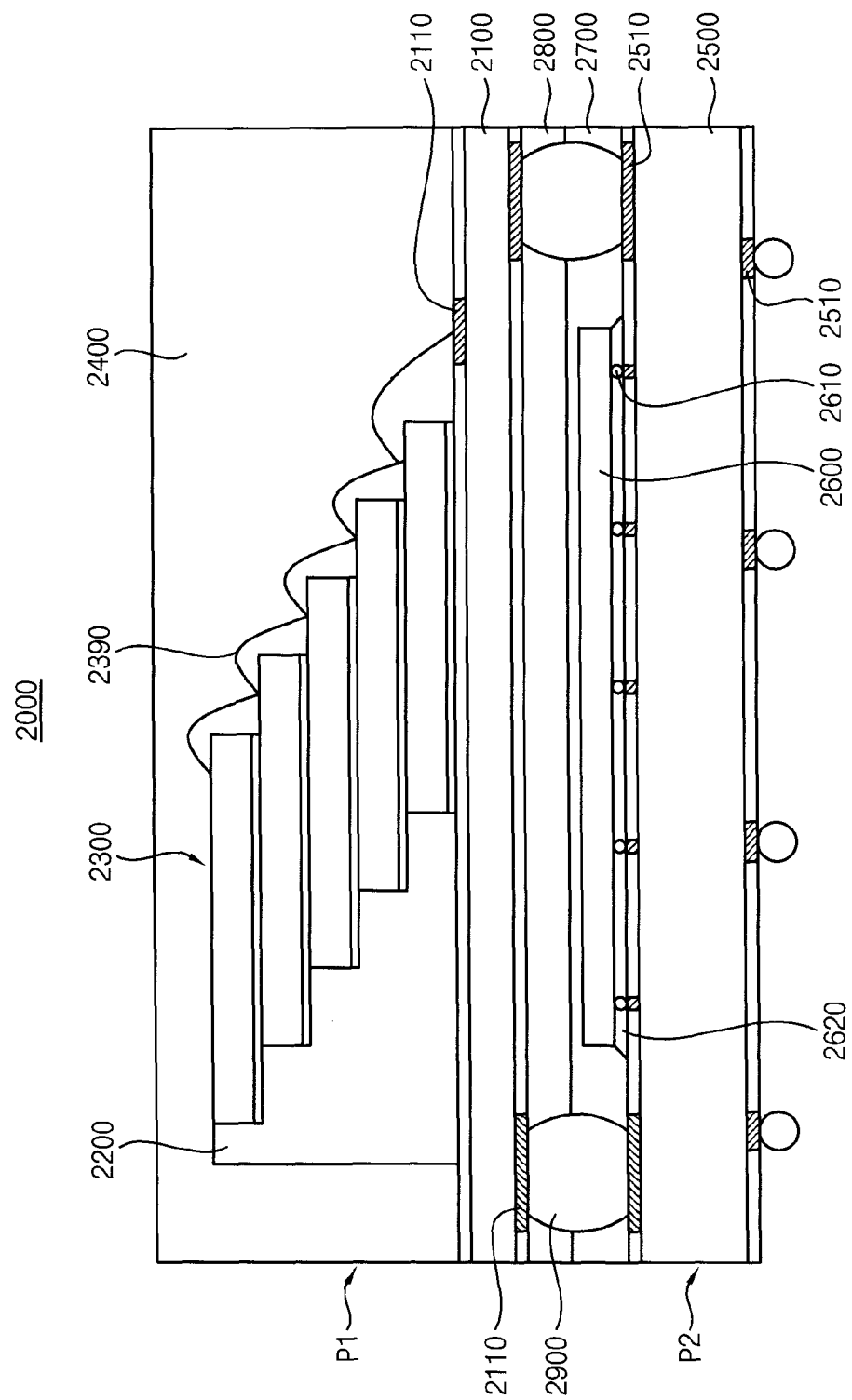
FIG. 3 is a cross-sectional view illustrating a semiconductor package in accordance with another example embodiment of the present inventive concepts.

FIG. 3 is a cross-sectional view illustrating a semiconductor package in accordance with another example embodiment of the present inventive concepts.

Referring to FIG. 3, the semiconductor package 2000 constructed in accordance with another example embodiment of the present inventive concepts may be applied to a package on package (PoP) structure in which a first package P1 is stacked on a second package P2. In the present example embodiment, the first package P1 may have substantially the same structures as the semiconductor package 1000 shown in FIGS. 1A and 1B, and the second package P2 may include a flip chip package.

The first package P1 may, for example, include a cascade-structured aligning guide 2200 having a plurality of stepped portions, each of which includes a vertical surface and a flat face. The aligning guide 2200 may be coupled to a first circuit board 2100, and a plurality of first semiconductor chips 2300 may be stacked on the circuit board 2100 following the cascade structure of the aligning guide 2200. The first semiconductor chips 2300 may thereby be readily aligned with and offset from each other by a desired offset length.

Each of the first semiconductor chips 2300 may contact the corresponding vertical surface of the aligning guide 2200 at the first peripheral portion thereof, and active faces of the first semiconductor chips 2300 may be exposed at the second peripheral portion thereof by an amount equal to the width of the stepped portions of the aligning guide 2200. Thus, contact pads on the active faces of the first semiconductor chips 2300 may be exposed to the surroundings. The exposed contact pads of the first semiconductor chips 2300 may be electrically connected to the bonding pads 2110 of the first circuit board 2100 by a bonding wire 2390. The aligning guide 2200, the first semiconductor chips 2300, and the bonding wire 2390 may be secured to the first circuit board 2100 by the first molding unit 2400. Because the configurations and functions of the first package P1 may be substantially the same as the semiconductor package 1000 shown in FIGS. 1A and 1B, further detailed description of the first package P1 will be omitted.

The second package P2 may comprise a second circuit board 2500 having inner circuit lines (not shown) and second bonding pads 2510 connected to the inner circuit lines. At least one second semiconductor chip 2600 may be mounted on the second circuit board 2500 and electrically connected to the second bonding pads 2510, and a second molding unit 2700 may be provided to secure the second semiconductor chip 2600 to the second circuit board 2500.

The second circuit board 2500 may be any one or more of various circuit boards. The second semiconductor chip 2600 may be mounted to the circuit board and may be electrically connected with external systems via the circuit board. In the present example embodiment, the second circuit board 2500 may be a printed circuit board (PCB) having a similar construction to the first circuit board 2100.

The second semiconductor chip 2600 may be an active device such as a memory chip, a logic chip, or any combination thereof. For example, the first semiconductor chips 2300 in the first package P1 may include a plurality of memory chips, and the second semiconductor chip 2600 in the second package P2 may include a logic chip for controlling the memory chips. Thus, the semiconductor package 2000 may include a memory package having a high memory capacity and a controller package for controlling the memory package.

As shown in FIG. 3, the second semiconductor chip 2600 may be arranged into a flip chip structure on the second circuit board 2500. A top face of the second semiconductor chip 2600 may be electrically connected to the bonding pads of the second circuit board 2500 through bump structures 2610. Through the bonding pads and bump structures 2610, the inner circuit pattern of the second circuit board 2500 may be electrically connected to the second semiconductor chip 2600. A second contact terminal 2510 may be provided on a bottom face of the second circuit board 2500, and the external systems (not shown) may be connected to the second contact terminal 2510.

The second semiconductor chip 2600 may be secured to the second circuit board 2500 by the second molding unit 2700, to protect the second semiconductor chip 2600 from the surroundings. The second molding unit 2700 may have substantially the same structure as the first molding unit 2400. While the second semiconductor chip 2600 may be substantially entirely covered with the second molding unit 2700, as illustrated in this embodiment, the surface of the second molding unit 2700 may also be coplanar with the bottom face of the second semiconductor chip 2600. In addition, a gap between the second circuit board 2500 and the second semiconductor chip 2600, which is formed due to the bumped structure 2610 corresponding to the boding pads, may be filled with an additional under-fill structure.

The first and the second packages P1 and P2 may be adhered to each other by an adhesive 2800. For example, the first package P1 may be adhered to the second package P2 by solder paste coated on a bottom face of the second molding unit 2700. The first package P1 may then be adhered to the bottom face of the second package P2. In addition, a dissipating plate (not shown) may be further interposed between the first and the second packages P1 and P2 along with a plurality of thermal plugs (not shown). The thermal plugs, connected to the dissipating plate, may be further connected to the first semiconductor chip 2300 through the first circuit board 2100. Therefore, heat generated from operating the first semiconductor chips 2300 may be efficiently dissipated out of the first package P1.

The first and the second packages P1 and P2 may also be electrically interconnected by board connectors 2900. The board connectors 2900 may have a ball structure interposed between a first contact terminal 2110 of the first circuit board 2100 and the second contact terminal 2510 of the second circuit board 2500. For example, a solder joint having good electrical conductivity may be used as the board connector 2900. In such a case, the board connector 2900 may penetrate through the second molding unit 2700 between the first and the second circuit boards 2100 and 2500, so that the board connector 2900 may be sufficiently secured in the second molding unit 2700.

Since a greater number of chips may be provided in the first package P1, a majority of the heat generated during operation of the semiconductor package 2000 may come from the first package P1. Thus, the first circuit board 2100 may tend to be distorted by warpage or bowing during operation of the semiconductor package 2000. Further, since the second circuit board 2500 is secured to the first second circuit board 2100, the distortion, warpage, or bowing of the first circuit board may also affect the second circuit board 2500. Accordingly, in order to prevent distortion, warpage, and bowing of the first circuit board 2100 and the second circuit board 2500, the aligning guide 2200 can be provided with a sufficient volume and shape to secure the durability of the semiconductor package 2000.

A method of manufacturing the semiconductor package shown in FIGS. 1A and 1B will now be described in detail with reference to FIGS. 1A-2, 4, and 5.

Figure 4:
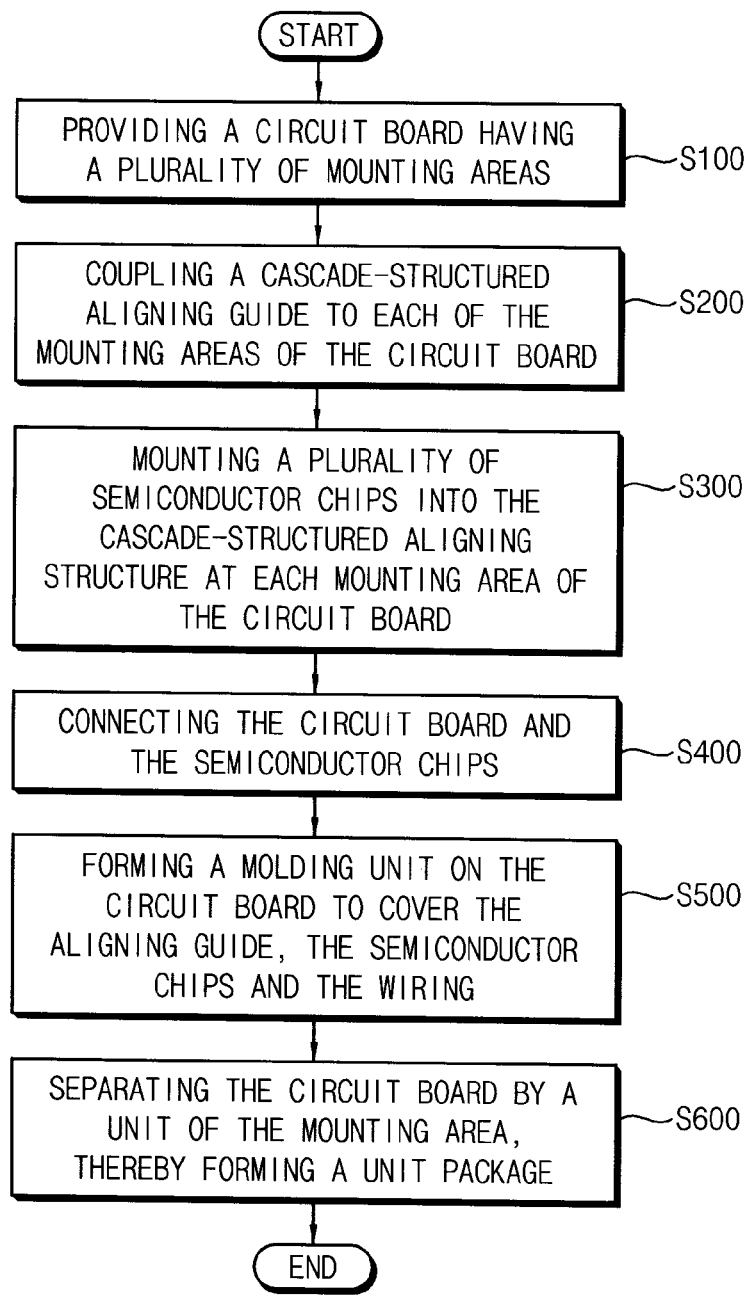
FIG. 4 is a flow chart showing processing steps according to a method of manufacturing the semiconductor package shown in FIGS. 1A and 1B.
Figure 5:
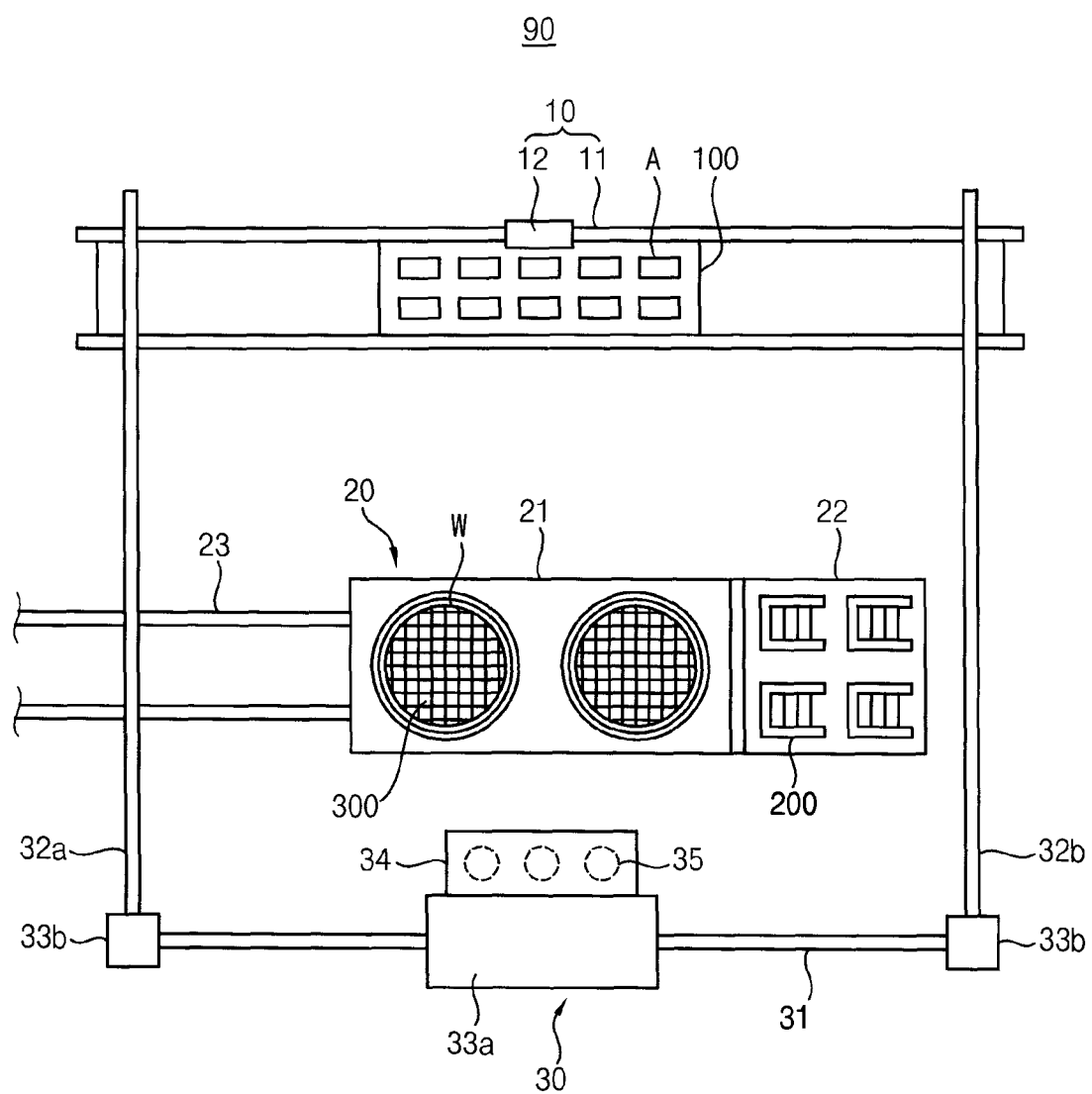
FIG. 5 is a somewhat schematic illustration of an apparatus for mounting semiconductor chips onto a circuit board.

FIG. 4 is a flow chart illustrating various processing steps in a method of manufacturing the semiconductor package shown in FIGS. 1A and 1B. FIG. 5 is a somewhat schematic view of an apparatus for mounting semiconductor chips onto a circuit board.

Referring to FIGS. 1A, 1B, 4, and 5, a circuit board 100 having a plurality of mounting areas A may first be prepared (in step S100).

The circuit board 100 may include a printed circuit board (PCB) having circuit patterns for transferring signals therein and the plurality of mounting areas A may be arranged in a matrix shape. A plurality of bonding pads 110 may be arranged at each of the mounting areas A of the circuit board 100. The circuit board 100 may be loaded to a board holder 10 of a chip mounting apparatus 90 by a board transfer chamber (not shown), such as a magazine.

An inspection process may be performed with respect to each of the mounting areas A of the circuit board 100, and the circuit board 100 may then be transferred from the board transfer chamber along a transfer rail 11. Thereafter, the circuit board 100 may be secured to the transfer rail 11 in a mounting position by a board gripper 12. The board gripper 12 may move along the transfer rail 11 at a constant speed and may be stopped on the transfer rail 11 during the chip mounting process.

The aligning guide 200 having the stepped or cascade structure may be mounted on each of the mounting areas A of the circuit board 100 (in step S200).

A plurality of aligning guides 200 and a plurality of wafers W having semiconductor chips 300 may be arranged in a provider 20 of the chip mounting apparatus 90. The aligning guides 200 and the semiconductor chips 300 may be individually picked up from the provider 20, and may be individually transferred to each of the mounting areas A.

For example, the aligning guides 200 may be arranged in a guide provider 22 of the provider 20, and the wafers W including the chips 300 may be arranged in a chip provider 21 of the provider 20. The aligning guides 200 may be arranged in rows and columns (i.e., a matrix arrangement) and may be picked up according to a preset picking procedure by a mounting unit 30. The picked aligning guide 200 may be individually mounted on a corresponding mounting area A of the circuit board 100 by the mounting unit 30. Before being mounted, the aligning guide 200 may be partially dipped into an adhesive reservoir (not shown) to coat the bottom face of the aligning guide 200 with the adhesive. Otherwise, the adhesive may be coated on the mounting area A of the circuit board 100 before the aligning guides 200 are mounted on the circuit board 100. In such a case, the process of coating the aligning guide 200 with adhesive may be omitted.

The aligning guide 200 may be formed by a separate process to include a plurality of stepped portions in a cascade structure, with each stepped portion having a flat face and a vertical surface. The aligning guide 200 may then be stacked in the alignment guide provider 22.

Alternatively, the aligning guide 200 may be formed integrally with the circuit board 100 in a manufacturing process of the circuit board 100. In such a case, the circuit board 100 having the aligning guide 200 formed thereon may be loaded onto the board holder 10, and the aligning guide mounting process is omitted.

A plurality of semiconductor chips 300 may then be stacked onto each of the mounting areas A of the circuit board 100 in such a way that the stacked semiconductor chips 300 engage with the stepped portions 211 to 215 of the aligning guide 200. More particularly, each chip 300 may be stacked into the cascade structure of the aligning guide 200 (in step S300) and coupled to the chip stack in such a way that the first peripheral portion 391 of each of the semiconductor chips 300 may contact a corresponding stepped portion of the aligning guide 200. An active face of each of the semiconductor chips 300 faces upwards and is exposed at a second peripheral portion 392.

A plurality of semiconductor chips 300 may, for example, be provided by separating processed wafers into individual pieces by a back grinding process or a sawing process. Then, the separate semiconductor chips 300 may be arranged on the wafer W as a group of singulated, individual chips 300. The wafer W may be installed on a wafer holder 21. Then, a dicing tape may be adhered to the bottom of the wafer W and a wafer ring may be provided along a circumferential line of the wafer W, so that the group of separated chips 300 joined to the wafer W may be loaded in the wafer holder 21 by using a wafer cassette (not shown).

The adhesivity of the dicing tape may be loosened in the wafer holder 21 by irradiating UV light toward the bottom of the wafer W, thereby expanding the dicing tape. After reducing the adhesiveness, the semiconductor chips 300 may then be easily picked up from the wafer W by the mounting unit 30.

The semiconductor chips 300 may be sequentially stacked on the circuit board 100 at each mounting area A. For example, after a predetermined number of semiconductor chips 300 are stacked at on one of the mounting areas A, the stacking process may then proceed at the next mounting area A.

Figure 6:
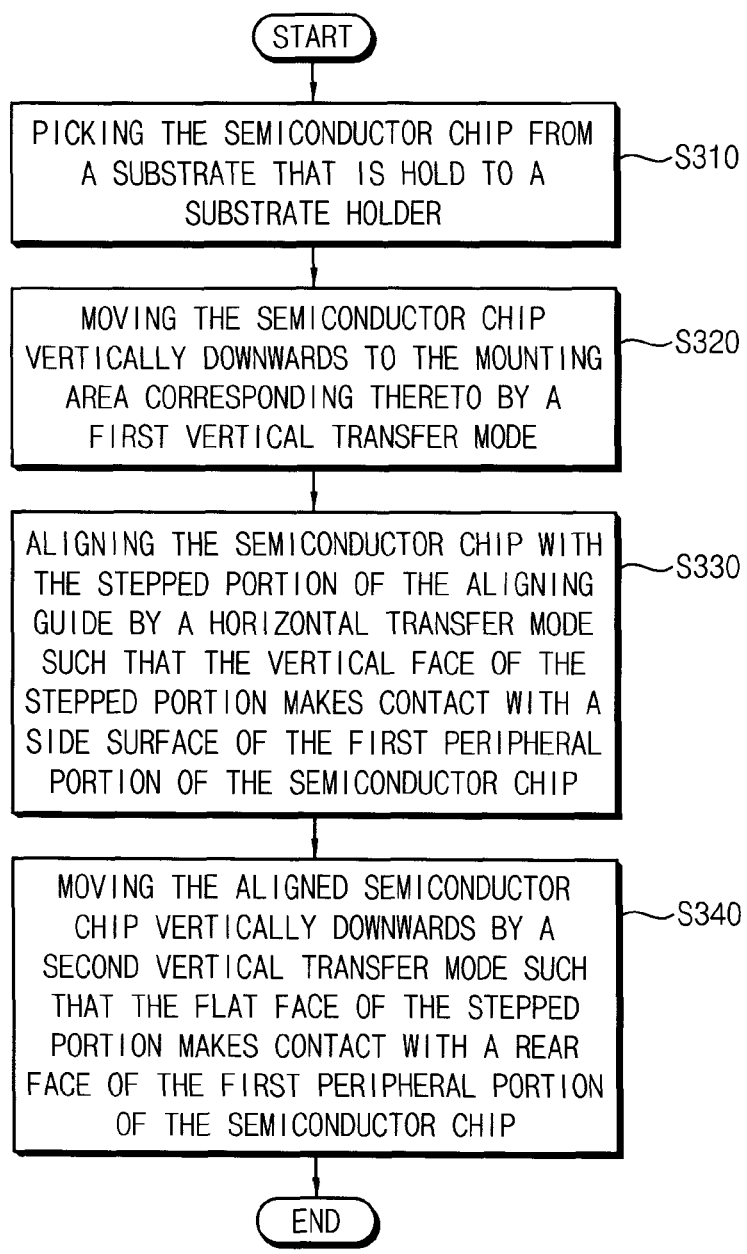
FIG. 6 is a flow chart showing processing steps for mounting semiconductor chips on a mounting area of the circuit board according to other principles of the present inventive concepts.

FIG. 6 is a flow chart illustrating processing steps for mounting semiconductor chips 300 on the mounting area A of the circuit board 100. FIGS. 7A to 7G are cross-sectional views illustrating processing steps for aligning the semiconductor chips 300 using the aligning guide 200 in the chip mounting process.

Referring to FIGS. 6 and 7A to 7G, the semiconductor chips 300 may be picked up from the wafer W arranged on a wafer holder 21 (in step S310).

The mounting unit 30 may, for example, absorb the semiconductor chip 300 or the aligning guide 200 into an absorption hole 35 of a mounting robot 34. The semiconductor chip 300 picked by the mounting robot 34 from the wafer W may be transferred to over the mounting area A of the circuit board 100. The aligning guide 200 picked from the guide provider 22 by the mounting robot 34 may also be transferred to over the mounting area A of the circuit board 100.

The mounting robot 34 may, for example, move along a first search rail 31 in a longitudinal direction of the circuit board 100 to search the mounting areas A. Then, the first search rail 31 and the mounting robot 34 may move together along a second search rail 32 in a latitudinal direction of the circuit board 100 to search the mounting areas A. Thus, the aligning guide 200 and the semiconductor chip 300 may be arranged in the appropriate location corresponding to the desired mounting area A of the circuit board 100 using the mounting robot 34.

The stacking process will now be explained in detail. First, the aligning guide 200 may be transferred to an area corresponding to the predetermined location of the mounting area A by the first and second search rails 31 and 32. The aligning guide 200 may then be mounted on or coupled to the predetermined mounting area A. Next, a plurality of semiconductor chips 300 may then be stacked on the mounting area A while being appropriately aligned with each other using the aligning guide 200.

Figure 7A:
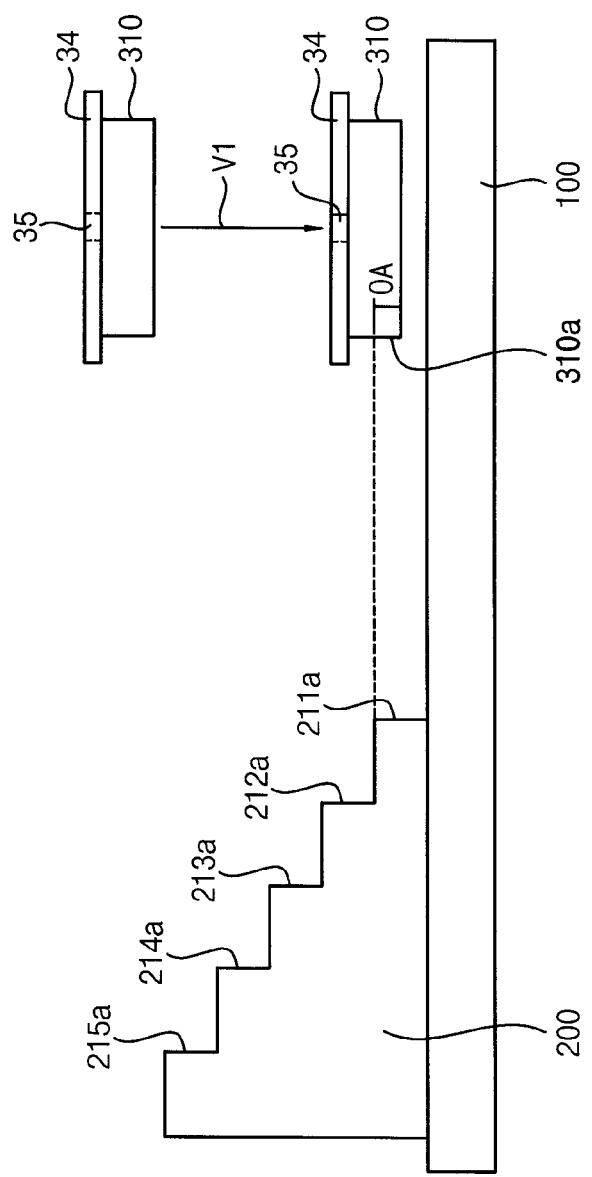

Referring to FIG. 7A, the first semiconductor chip 310 may be transferred over the location of the mounting area A using the first and second search rails 31 and 32. The first semiconductor chip 310 may be arranged a distance apart from the first vertical face 211a of the previously-mounted (or integrally formed) aligning guide 200. The chip 310 is then moved downwards in a vertical direction (V1) toward the circuit board 100 in a first vertical transfer process (in step S320). For example, the first chip 310 may be moved over the mounting area A by the mounting robot 34 and may then be moved vertically downwards V1 to the mounting area A of the circuit board 100 by the first vertical transfer process until its side surface 310a is partially aligned in a vertical direction with the first vertical face 211a of the aligning guide 200 as much as an overlap amount OA.

Figure 7B:
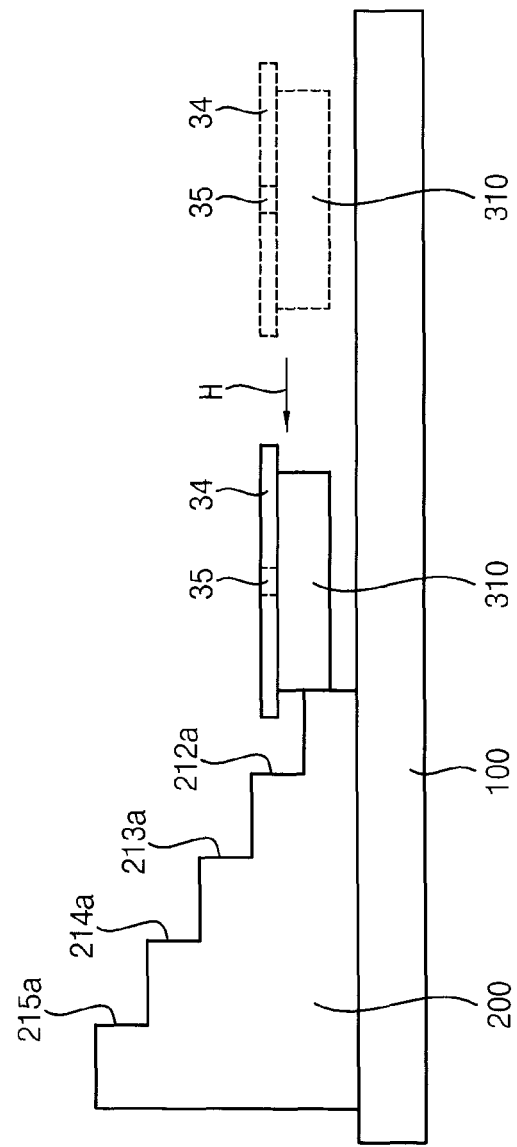

Then, referring to FIG. 7B, the first semiconductor chip 310 may be moved in a horizontal direction H toward the aligning guide 200 by a horizontal transfer process (in step S330) until the side surface 310a of the first semiconductor chip 310 contacts the first vertical surface 211a of the aligning guide 200.

When the first vertical surface 211a contacts the first side surface 310a, the horizontal transfer motion of the first chip 310 may be stopped. In this case, as explained in the first embodiment, if the aligning guide 200 is composed of material softer than the material of the first semiconductor chip 310, the damage to the first semiconductor chip 310 caused by contact with the aligning guide 310 may be minimized.

Figure 7C:
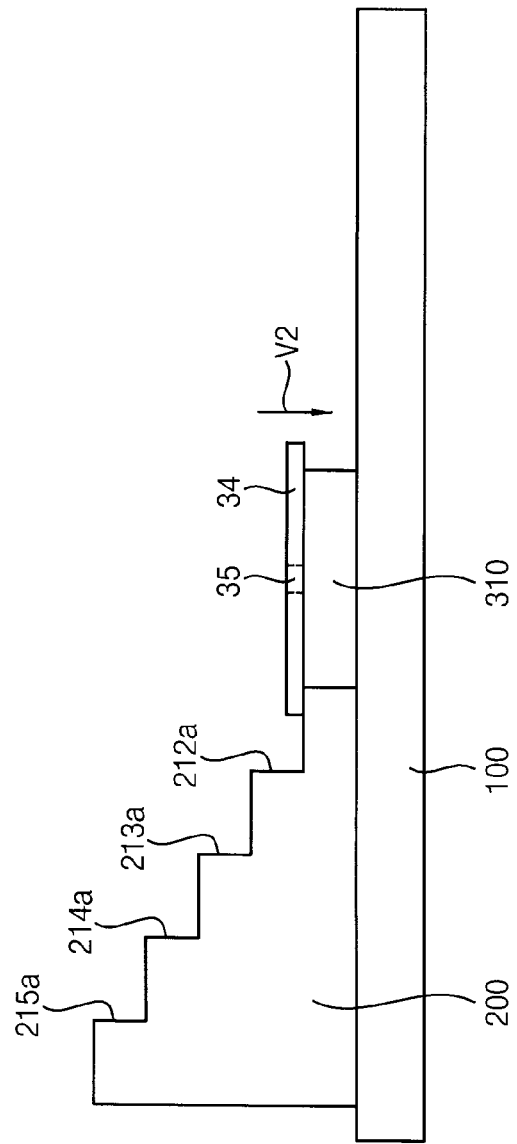

Then, referring to FIG. 7C, the first semiconductor chip 310 may be moved further downwards in a vertical direction (V2) toward the circuit board 100 in a second vertical transfer process until the bottom face 310b of the first semiconductor chip 310 in the first peripheral region 391 contacts the top face of the circuit board 100. As a result, the bottom face of the first chip 310 may contact the upper surface of the circuit board 100, and the side surface 310a of the first peripheral portion 391 of the first chip 310 may contact with the first vertical surface 211a of the aligning guide 200.

Through the above second process, the mounting location of the first semiconductor chip 310 may be determined according to the shape and the dimension of the aligning guide 200, so the accuracy of the mounting location may be enhanced. The location of the first side surface 310a of the first chip 310 may be determined by the first vertical surface 211a of the aligning guide 200, and thus the location of the first chip 310 may be determined by the aligning guide 200, thereby increasing the mounting accuracy of the first chip 310.

The mounting robot 34 may then be separated from the first chip 310 and may move to pick up the second chip 320 from the wafer W.

Figure 7D:
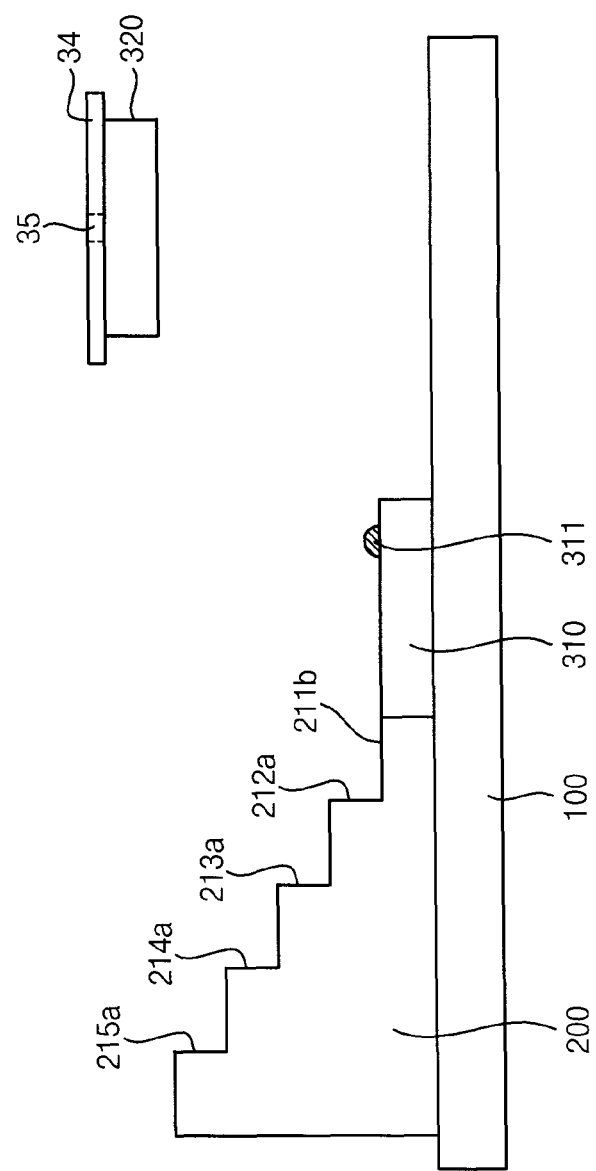
Figure 7E:
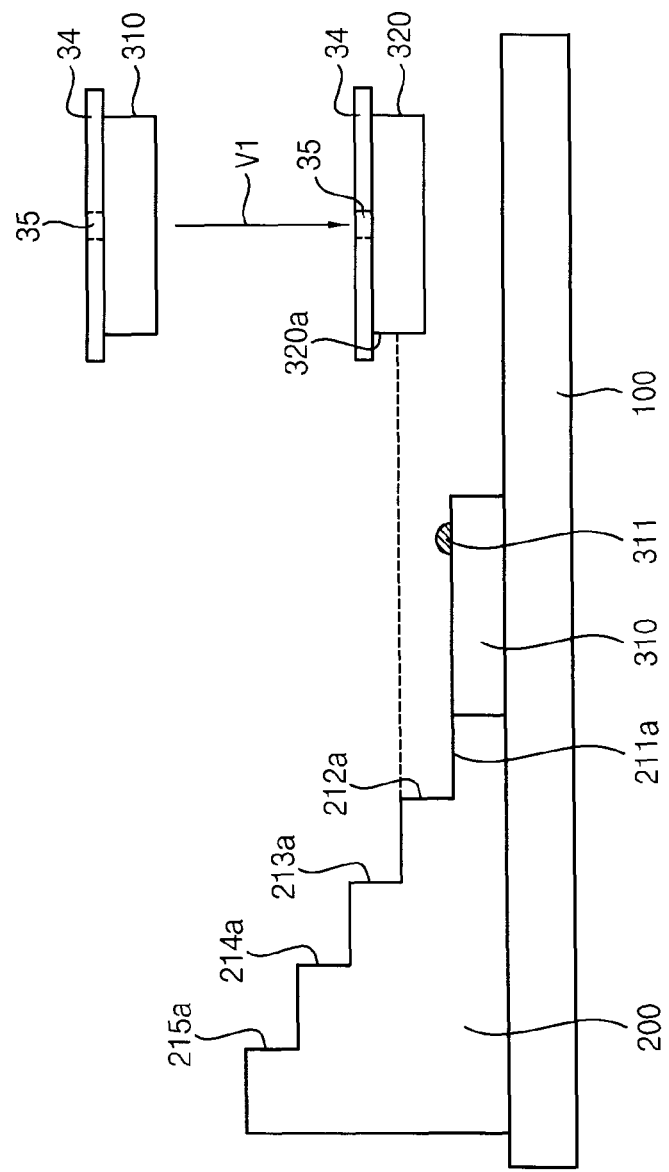
Figure 7G:
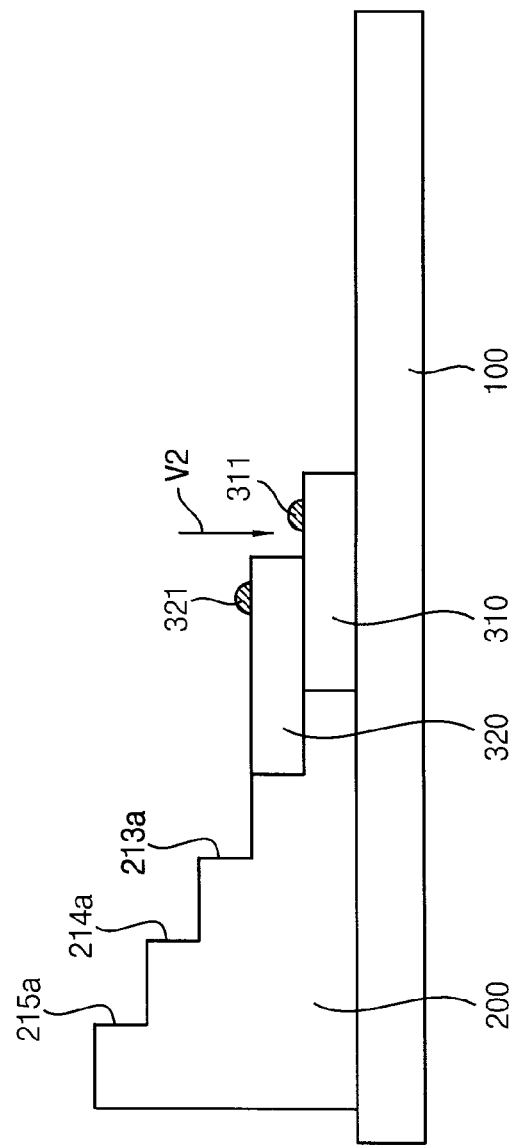

Referring to FIGS. 7D and 7E, the second semiconductor chip 320 may be transferred over the mounting area A using the mounting robot 34 and the first and second search rails 31 and 32, respectively, in the same manner as described previously with respect to the first semiconductor chip 310. The second semiconductor chip 320 may then be moved downwards in a vertical direction V1 toward the circuit board 100 until a portion of its side surface 320a is aligned with a corresponding portion of the second vertical surface 212a of the aligning guide 200.

Then, referring to FIG. 7F, the second semiconductor chip 320 may be moved in a horizontal direction H toward the mounted aligning guide 200 until the side surface 320a of the second semiconductor chip 320 contacts the second vertical surface 212a of the mounted aligning guide 200.

Then, referring to FIG. 5G, the second semiconductor chip 320 may be moved in a vertical direction (V2) toward the circuit board 100 again until the bottom face 320b of the second semiconductor chip 320 contacts with the first flat face 211b of the mounted aligning guide 200 and the top face 310c of the first semiconductor 310. Through this process, the second semiconductor chip 320 may be shifted with respect to the first semiconductor chip 310 by the offset length determined by the width of the stair step 211a. If the sizes of the first and the second semiconductor chips 310 and 320 are equal, the exposed area of the first semiconductor chip along the second peripheral portion 392 will be the same as the stair width SW of the first flat face 211a. Accordingly, the first and the second chips 310 and 320, respectively, may be stacked in a cascade structure at the mounting area A of the circuit board 100, with the first contact pad 311 of the first chip 310 sufficiently exposed along the second peripheral portion 392.

In a similar way, the third to fifth semiconductor chips 330, 340, and 350, respectively, may be vertically stacked onto the mounting area A of the circuit board 100, with top faces of the second to fourth semiconductor chips 320, 330, and 340, respectively, exposed in an amount substantially equal to the stair width SW.

The contact pads 311, 321, 331, 341, and 351, located on the respective ones of the exposed top faces, may be electrically connected to the bonding pad 110 by the connector 400 (in step S400), thereby connecting the semiconductor chips 300 to the circuit board 100. In this embodiment, the fifth to first contact pads 351, 341, 331, 321, and 311, respectively, may be sequentially connected to each other in series, and the first contact pad 311 may be connected to the bonding pad 110. As a result, when the semiconductor chips 300 are memory chips, the semiconductor package 1000 may have an increased memory capacity corresponding to the sum of the memory capacities of the first to fifth chips 310, 320, 330, 340, and 350, respectively.

Referring back to FIG. 1B, the molding unit 500 may be formed on the circuit board 100 having a sufficient thickness to cover the aligning guide 200, the semiconductor chips 300, and the connector 400 (in step S500). The circuit board 100 may then be separated into unit packages with each unit defined by a corresponding mounting area A (in step S600).

According to the above method, a cascade-structured aligning guide may be coupled to each mounting area of a circuit board. A first peripheral portion of the stacked semiconductor chips may contact the aligning guide in such a way that a side surface and a bottom face of the first peripheral portion of the semiconductor chip engage a vertical surface and flat face of the aligning guide. A plurality of semiconductor chips may be stacked on the mounting area by sequential performing a first vertical transfer process, a horizontal transfer process, and a second vertical transfer process for each chip. The transfer processes align the first peripheral portions of the semiconductor chips with the aligning guide on the circuit board, thereby increasing the mounting accuracy of the semiconductor chips.

Figure 8:
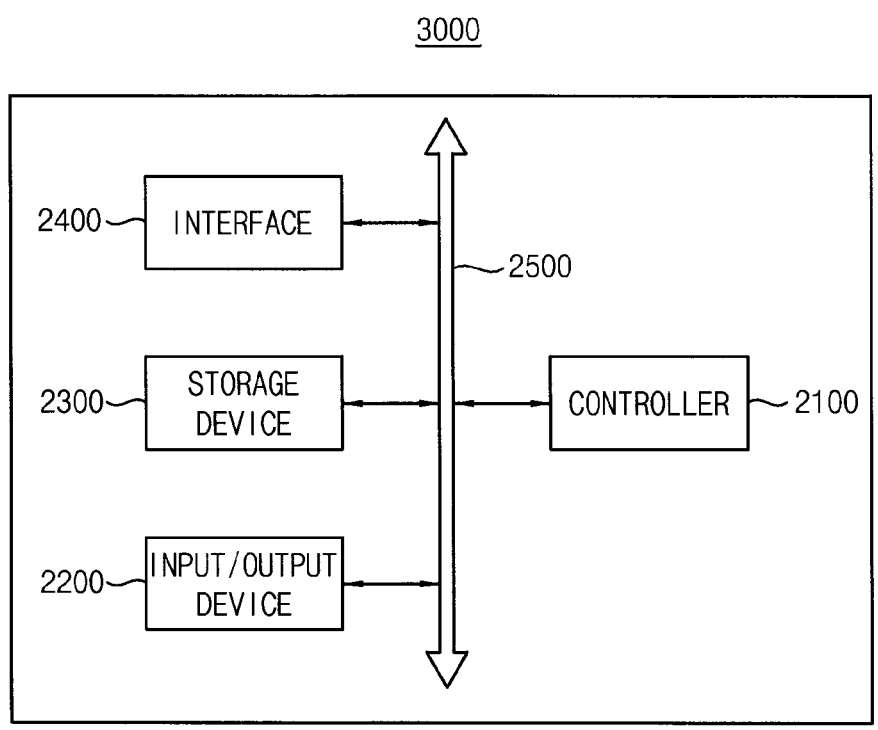
FIG. 8 is a schematic block diagram illustrating an electronic system that may include a semiconductor package constructed in accordance with the present inventive concepts.

FIG. 8 is a schematic block diagram illustrating an electronic system 3000 that may include one or more semiconductor packages constructed in accordance with the present inventive concepts.

Referring to FIG. 8, the electronic system 3000 may comprise a controller 2100, an input/output device 2200, a storage device 2300, an interface 2400 and a bus line 2500.

The storage unit 2300 may comprise one or more semiconductor packages constructed in accordance with the present inventive concepts. More particularly, the packages may include one or more chip stack packages as described in detail with reference to FIGS. 1A and 1B, one or more package-on-package (PoP) devices described in detail with reference to FIG. 3, or one or more of both types of packages. Since semiconductor packages for the storage device 2300 may be formed with high mounting accuracy using the aligning guide, contact pads located on the exposed top faces may be solidly connected to the bonding pads of the circuit board. Accordingly, the storage device 2300 may have high reliability and stability.

The bus line 2500 may function as a data communication path between the controller 2100, the input/output device 2200, the storage device 2300 and the interface 2400. The controller 2100 may comprise at least one of a microprocessor, a digital signal processor, and a logic device similar to the microprocessor and the digital signal processor.

The input/output device 2200 may comprise a keypad, a keyboard, and/or a display device. The storage device 2300 may store various instructors for the controller 2100 and processed data.

The storage device 2300 may include a volatile memory chip such as a DRAM device and an SRAM device, a non-volatile memory device such as a flash memory device, a phase change memory device, a magnetic RAM device, a resistive RAM device, and combinations thereof.

The interface 2400 may send and receive various data through communication networks. For example, the interface 2400 may comprise an antenna and/or a wire or a wireless transceiver.

The electronic system 3000 may further comprise an application chipset, a camera image processor and various additional input/output devices.

The electronic system 3000 may be applied to a mobile system, a personal computer system, an industrial computer system and various logic systems. For example, the mobile system may include one or more of a personal digital assistant (PDA), a notebook computer, a web tablet, a memory card, a digital music system, and an information processing system.

In addition, the electronic system 3000 may also be applied to communication systems such as CDMA (Code Division Multiple Access), GSM (Global System for Mobile communication), NADC (North American Digital Cellular), E-TDMA (Enhanced-Time Division Multiple Access), WCDAM (Wideband Code Division Multiple Access), CDMA100b0, etc.

According to the above exemplarily embodiments of the present inventive concepts, using an aligning guide having a stepped portion engaging with a plurality of stacked semiconductor chips, a large number of semiconductor chips may be stacked on a circuit board with high accuracy and sufficient margin. In addition, the stacked semiconductor package may have high structural stability and high resistance to warpage and distortion. This may result in reducing the rate of failure and defects in the chip stacking process and in enhancing reliability and stability of the end product.

More particularly, the cascade-structured aligning guide may be arranged on the circuit board and the stacked semiconductor chips may be readily aligned with each other at the first peripheral portions thereof using the aligning guide. The aligning guide may include a plurality of stepped portions, each having a flat face and a vertical surface. The vertical surface may contact a side surface of a corresponding semiconductor chip and the flat face may contact a bottom surface of a corresponding semiconductor chip at first peripheral portions thereof. The semiconductor chips may thereby be shifted from each other by an offset length corresponding to a width of the stepped portion.

In this manner, the semiconductor chips may be aligned with each other by the desired offset length using the step-shaped structure of the aligning guide. Active faces of the semiconductor chips may further be exposed to the surroundings at second peripheral portions thereof in an amount substantially equal to the offset length. Accordingly, contact pads on the active faces may be sufficiently exposed to surroundings despite the vertically stacked structure of the semiconductor chips on the circuit board. In addition, the aligning guide may help prevent warpage of the circuit board while operating the semiconductor package 1000, thereby reducing the operation failures of the semiconductor package 1000.

Accordingly, operational failures of semiconductor packages constructed according to principles of the inventive concepts may be minimized, and electronic systems including the semiconductor package of these inventive concepts may have improved operational stability and reliability.

The present inventive concepts may be applied to various electronic systems including semiconductor chips, such as various communication systems and storage systems, for instance.

The foregoing description is illustrative of various possible embodiments and is not to be construed as limiting the inventive concepts. Although a few example embodiments have been described, those skilled in the art will readily appreciate that many modifications are possible without materially departing from the novel teachings and advantages of the inventive concepts provided herein. Accordingly, all such modifications are intended to be included within the scope of the inventive concepts as defined in the claims. In the claims, means-plus-function clauses where present are intended to cover the structures described herein as performing the recited function and not only structural equivalents but also equivalent structures.

What is claimed is:

1. A semiconductor package comprising:
a first circuit board;
an aligning guide mounted on the circuit board and having a plurality of stepped portions; and
a plurality of semiconductor chips stacked one on top of another on the circuit board and contacting respective stepped portions of the aligning guide,
wherein a gap between the circuit board and portions of the semiconductor chips arranged on the aligning guide is substantially filled by the aligning guide.

2. The semiconductor package of claim 1, wherein each of the stepped portions of the aligning guide comprises a vertical surface, and wherein the vertical surface of each stepped portion has a height substantially equal to a thickness of a corresponding one of the semiconductor chips.

3. The semiconductor package of claim 1, wherein the aligning guide is adhered to the circuit board by an adhesive.

4. The semiconductor package of claim 1, further comprising a molding unit substantially covering the aligning guide, each of the semiconductor chips, and a connector electrically connecting the circuit board and the plurality of the semiconductor chips.

5. The semiconductor package of claim 1, wherein the aligning guide comprises an elastic resin.

6. The semiconductor package of claim 1, further comprising a second circuit board on which the first circuit board is stacked.

7. The semiconductor package of claim 6, further comprising a flip chip mounted semiconductor chip having an active face electrically connected to a bonding pad of the second circuit board.

8. The semiconductor package of claim 7, wherein the first circuit board and the second circuit board are electrically interconnected by a board connector.

9. The semiconductor package of claim 1, wherein each of the stacked semiconductor chips has a top face and a wherein a portion of each of the top faces of those semiconductor chips arranged beneath at least one other semiconductor chip is exposed along an edge portion by an amount determined by the shape and dimension of the stepped portion of the aligning guide.

10. The semiconductor package of claim 9, wherein each stepped portion of the aligning guide comprises a flat face having substantially the same dimensions as the flat faces of the other stepped portions, and wherein the semiconductor chips each have substantially the same dimensions as each other, such that the exposed portions of each of the covered semiconductor chips have substantially the same dimensions as each other.

11. The semiconductor package of claim 9, wherein at least one of the stacked semiconductor chips has a contact pad on the exposed portion of its top face, and wherein the contact pad is electrically connected to the circuit board.

12. The semiconductor package of claim 1, wherein a hardness of the aligning guide is less than a hardness of the semiconductor chips.

13. A semiconductor package comprising:
a first circuit board;
an aligning guide mounted on the circuit board and having a plurality of stepped portions; and
a plurality of semiconductor chips stacked one on top of another on the circuit board and contacting respective stepped portions of the aligning guide,
wherein each of the stacked semiconductor chips has a top face and a wherein a portion of each of the top faces of those semiconductor chips arranged beneath at least one other semiconductor chip is exposed along an edge portion by an amount determined by the shape and dimension of one of the stepped portions of the aligning guide.

14. The semiconductor package of claim 13, wherein each stepped portion of the aligning guide comprises a flat face having substantially the same dimensions as the flat faces of the other stepped portions, and wherein the semiconductor chips each have substantially the same dimensions as each other, such that the exposed portions of each of the covered semiconductor chips have substantially the same dimensions as each other.

15. The semiconductor package of claim 13, wherein at least one of the stacked semiconductor chips has a contact pad on the exposed portion of its top face, and wherein the contact pad is electrically connected to the circuit board.

16. The semiconductor package of claim 13, wherein a gap between the circuit board and portions of the semiconductor chips arranged on the aligning guide is substantially filled by the aligning guide.

17. A semiconductor package comprising:
- a first circuit board;
- an aligning guide mounted on the circuit board and having a plurality of stepped portions; and
- a plurality of semiconductor chips stacked one on top of another on the circuit board and contacting respective stepped portions of the aligning guide,
- wherein a hardness of the aligning guide is less than a hardness of the semiconductor chips.

18. The semiconductor package of claim 17, wherein a gap between the circuit board and portions of the semiconductor chips arranged on the aligning guide is substantially filled by the aligning guide.

* * * * *